US012736600B2

(12) United States Patent
Sun et al.

(10) Patent No.: US 12,736,600 B2
(45) Date of Patent: Sep. 15, 2026

(54) MULTI-CORE INTEGRATED MAGNETIC RESONANCE IMAGING SYSTEM WITH DISTRIBUTED, PARALLEL, AND SCALABLE ARCHITECTURE

(71) Applicant: Harbin Medical University, Harbin (CN)

(72) Inventors: Xilin Sun, Harbin (CN); Chuanxing Wu, Harbin (CN); Kai Wang, Harbin (CN); Yongyue Wu, Harbin (CN); Haoxuan Wu, Harbin (CN); Pengcheng Cheng, Harbin (CN); Lixin Cheng, Harbin (CN); Yongyi Wu, Harbin (CN); Lili Yang, Harbin (CN); Lina Wu, Harbin (CN)

(73) Assignee: HARBIN MEDICAL UNIVERSITY, Harbin (CN)

( * ) Notice: Subject to any disclaimer, the term of this patent is extended or adjusted under 35 U.S.C. 154(b) by 118 days.

(21) Appl. No.: 19/006,269

(22) Filed: Dec. 31, 2024

(65) Prior Publication Data

US 2026/0050052 A1 Feb. 19, 2026

(30) Foreign Application Priority Data

Aug. 13, 2024 (CN) ........................ 202411108110.X

(51) Int. Cl.
*G01R 33/36* (2006.01)
*G01R 33/385* (2006.01)
(Continued)

(52) U.S. Cl.
CPC ..... *G01R 33/3607* (2013.01); *G01R 33/3621* (2013.01); *G01R 33/3635* (2013.01);
(Continued)

(58) Field of Classification Search
CPC ........... G01R 33/3607; G01R 33/3621; G01R 33/3635; G01R 33/3852; G01R 33/446;
(Continued)

(56) References Cited

U.S. PATENT DOCUMENTS 10,705,169 B2 7/2020 Zhou et al.
RE50,920 E * 6/2026 Van de Moortele ........................ G01R 33/583
2010/0256477 A1* 10/2010 Harvey ............. G01R 33/3635 600/410

FOREIGN PATENT DOCUMENTS

CN 105785293 A 7/2016
CN 110811619 A * 2/2020 ............ A61B 5/055

OTHER PUBLICATIONS

Zidan Yu, et al., Simultaneous proton MRF and sodium MRI, Magn Reson Med., 2020, pp. 2232-2242, vol. 83 No. 6.

* cited by examiner

*Primary Examiner* — Christopher E Mahoney
(74) *Attorney, Agent, or Firm* — Bayramoglu Law Offices LLC

(57) ABSTRACT

A parallel scalable architecture and highly integrated Simulcast X-nuclei MRI system includes a multi-nuclear scanning and reconstruction computer and a multi-nuclear scanning control unit. The multi-nuclear scanning control unit includes a multi-nuclear timing sequence control engine, a multi-nuclear radio frequency (RF) signal transmission unit, a multi-nuclear RF signal acquisition unit, a gradient signal generation unit, and a multi-nuclear coil tuning control unit. The multi-nuclear timing sequence control engine is separately connected to the multi-nuclear RF signal transmission unit, the multi-nuclear RF signal acquisition unit, the gradient signal generation unit and the multi-nuclear coil tuning control unit. The parallel scalable architecture and highly
(Continued)

integrated Simulcast X-nuclei MRI system is designed to support synchronous or time-sharing excitation and acquisition of signals of a plurality of types of nuclides, including but not limited to hydrogen, fluorine, phosphorus, sodium, and other nuclides.

7 Claims, 5 Drawing Sheets

(51) Int. Cl.
*G01R 33/44* (2006.01)
*G01R 33/54* (2006.01)
*G01R 33/56* (2006.01)
*G01R 33/561* (2006.01)

(52) U.S. Cl.
CPC ....... *G01R 33/3852* (2013.01); *G01R 33/446* (2013.01); *G01R 33/543* (2013.01); *G01R 33/5608* (2013.01); *G01R 33/5612* (2013.01)

(58) Field of Classification Search
CPC .............. G01R 33/543; G01R 33/5608; G01R 33/5612; G01R 33/3628; A61B 5/055
See application file for complete search history.

MULTI-CORE INTEGRATED MAGNETIC RESONANCE IMAGING SYSTEM WITH DISTRIBUTED, PARALLEL, AND SCALABLE ARCHITECTURE

CROSS-REFERENCE TO THE RELATED APPLICATIONS

This application is based upon and claims priority to Chinese Patent Application No. 202411108110.X, filed on Aug. 13, 2024, the entire contents of which are incorporated herein by reference.

TECHNICAL FIELD

The present disclosure relates to the technical field of medical images, and specifically, to a parallel scalable architecture and highly integrated Simulcast X-nuclei MRI system.

BACKGROUND

Magnetic resonance imaging (MRI) has been widely used in preclinical research and medical diagnosis. Traditional MRI focuses on proton ($^{1}$H) imaging and can provide functional and morphological information. Endogenous phosphorus ($^{31}$P) and sodium ($^{23}$Na) in living organisms are also magnetic resonance (MR) sensitive nuclides and can provide information that cannot be acquired solely by the $^{1}$H imaging. Moreover, fluorine ($^{19}$F) has no background signal in the living organisms, but has a high gyromagnetic ratio, and a wide range of chemical shift distribution in its compounds, which is helpful for imaging through a chemical shift selective excitation technology. Therefore, $^{19}$F probes are often used as targeting reagents, tracers, drug carriers, and the like for in-vivo studies. Application scenarios of multi-nuclear imaging have attracted more attention.

As a core control component of MR equipment, a spectrometer is mainly used to provide pulse commands and control signals for various sub-modules in an MRI system. Most existing spectrometers only support excitation and acquisition of single $^{1}$H nuclide signals. A multi-nuclear/dual-nuclear control scheme reported in the literature adds a frequency conversion module to a single-nuclear MRI system to achieve excitation and reception of non-$^{1}$H frequencies. For example, a similar method is adopted in the Chinese invention patent: 201610094660. X Device Having Inert Gas Atomic Nucleus Channel and Method for Magnetic Resonance Imaging, and the U.S. Pat. No. 10,705,169 B2 (Device Having Inert Gas Nucleus Channel and Method for Magnetic Resonance Imaging Using the Same). Such method is typically used for sequential imaging of two or more types of nuclides, or for alternating excitation and acquisition of two types of nuclides within a same TR, and does not support synchronous transmission of radio frequency (RF) pulses. In the literature Simultaneous proton magnetic resonance fingerprinting and sodium MRI (YU Z D, MADELIN G, SODICKSON D K, et al. Magn Reson Med, 2020, 83(6): 2232-42), a frequency synthesizer is added and a reception link is modified to achieve adjacent excitation and synchronous reception of RF signals of two types of nuclides. However, the above methods all have potential problems. For example, additional data processing such as phase correction is required due to the difference between frequency resolutions of the added frequency synthesizer and a frequency synthesizer of the system itself, and it is difficult to achieve synchronous imaging of three or more types of nuclides.

SUMMARY

An objective of the present disclosure is to provide a parallel scalable architecture and highly integrated Simulcast X-nuclei MRI system to solve the problems described above.

In order to achieve the above objective, the present disclosure provides the following technical solutions:

A parallel scalable architecture and highly integrated Simulcast X-nuclei MRI system includes a multi-nuclear scanning and reconstruction computer and a multi-nuclear scanning control unit, where the multi-nuclear scanning control unit includes a multi-nuclear timing sequence control engine, a multi-nuclear RF signal transmission unit, a multi-nuclear RF signal acquisition unit, a gradient signal generation unit, and a multi-nuclear coil tuning control unit; the multi-nuclear timing sequence control engine is separately connected to the multi-nuclear RF signal transmission unit, the multi-nuclear RF signal acquisition unit, the gradient signal generation unit and the multi-nuclear coil tuning control unit; the gradient signal generation unit is also connected to a gradient power amplifier; the multi-nuclear coil tuning control unit and the multi-nuclear RF signal acquisition unit are both connected to a multi-nuclear RF coil; and the multi-nuclear timing sequence control engine and the multi-nuclear RF signal acquisition unit are both connected to the multi-nuclear scanning and reconstruction computer.

As a further technical solution of the present disclosure, the multi-nuclear scanning and reconstruction computer is connected to the multi-nuclear scanning control unit, and configured to receive a user scanning command, calculate and send a multi-nuclear scanning parameter to the multi-nuclear scanning control unit, and receive K-space original data of multi-nuclide MRI of the multi-nuclear scanning control unit.

As a further technical solution of the present disclosure, the multi-nuclear timing sequence control engine is configured to receive and parse scanning information of a plurality of nuclides, generate a scanning event, and send the scanning event to the multi-nuclear RF signal transmission unit, the multi-nuclear RF signal acquisition unit, the gradient signal generation unit and the multi-nuclear coil tuning control unit to achieve MRI.

As a further technical solution of the present disclosure, the multi-nuclear RF signal transmission unit includes a plurality of RF transmission channels, each of the RF transmission channels includes a digital-to-analog conversion chip DAC, a bandpass filtering circuit BPF and a gain control circuit, and each nuclide uses one RF transmission channel, where an input terminal of the digital-to-analog conversion chip DAC is connected to an RF waveform control module, an output terminal of the digital-to-analog conversion chip DAC is connected to an input terminal of the bandpass filtering circuit BPF, an output terminal of the bandpass filtering circuit BPF is connected to an input terminal of the gain control circuit, and an output terminal of the gain control circuit is connected to the multi-nuclear RF coil.

As a further technical solution of the present disclosure, the multi-nuclear RF signal acquisition unit includes a plurality of RF reception channels, each of the RF reception channels includes an analog-to-digital conversion chip ADC, a bandpass filtering circuit BPF and a gain control circuit, each nuclide uses the plurality of RF reception channels, an output terminal of the multi-nuclear RF coil is connected to an input terminal of the filtering circuit, an output terminal of the bandpass filtering circuit BPF is connected to an input terminal of the gain control circuit, an output terminal of the gain control circuit is connected to an input terminal of the analog-to-digital conversion chip ADC, an output terminal of the analog-to-digital conversion chip ADC is connected to a double data rate synchronous dynamic random access memory DDRSDRAM of each nuclide, and the double data rate synchronous dynamic random access memory DDRSDRAM of each nuclide is connected to the multi-nuclear scanning and reconstruction computer.

As a further technical solution of the present disclosure, the gradient signal generation unit is configured to generate three gradient waveforms (Gx, Gy, and Gz) and a gradient power amplifier control signal, each gradient waveform driver includes a gradient digital waveform generator and a gradient digital-to-analog converter DAC (namely, a gradient-X DAC, a gradient-Y DAC, and a gradient-Z DAC), and is output to the gradient power amplifier through a port of a spectrometer control system, the three gradient waveforms enter a spectrometer output panel connector I, a gradient power amplifier control unit generates the gradient power amplifier control signal and outputs the gradient power amplifier control signal to a spectrometer output panel connector II, the spectrometer output panel connector I and the spectrometer output panel connector II are both connected to a wiring adapter board of the gradient power amplifier, and are simultaneously connected to the gradient power amplifier through the wiring adapter board of the gradient power amplifier, and the gradient power amplifier returns gradient power amplifier monitoring signals of X, Y, and Z axes in real time during working, and sends the gradient power amplifier monitoring signals to gradient power amplifier output monitoring terminals X, Y, and Z of the wiring adapter board of the gradient power amplifier. The Gx is a differential signal, which is output to the gradient power amplifier. Then the gradient power amplifier respectively outputs two signals to Gx+ and Gx−. The same principle is followed for the Gy and the Gz.

The gradient signal generation unit is configured to generate three gradient digital waveforms and the gradient power amplifier control signal. Each gradient waveform driver includes the gradient digital waveform generator and the gradient digital-to-analog converter DAC, and is output to the gradient power amplifier through the port of the spectrometer control system. The three gradient waveforms enter the spectrometer output panel connector I, the gradient power amplifier control unit generates the gradient power amplifier control signal and outputs the gradient power amplifier control signal to the spectrometer output panel connector II, and the spectrometer output panel connector I and the spectrometer output panel connector II are both connected to the wiring adapter board of the gradient power amplifier.

As a further technical solution of the present disclosure, the multi-nuclear coil tuning control unit is configured to receive multi-nuclide reception and transmission timing parameters from the multi-nuclear timing sequence control engine, and calculate level signals used to drive control of transmission, reception, resonance, and detuning states of a multi-nuclear RF MR coil.

Compared with the prior art, the present disclosure has the following beneficial effects:

Due to different contents of different nuclides in various tissues of a human body, signal intensity generated after each nuclide is excited is different. A reception gain corresponding to each nuclide can be independently controlled, for example, an amplification factor of a reception gain of a non-H nuclide with a low content in the body is increased to reduce a signal intensity difference between various nuclides.

Each RF reception unit corresponds to one nuclide, and each RF reception unit consists of at least 4 RF reception channels.

Each RF reception unit has an independent control terminal, and can collect a plurality of nuclides simultaneously or in a time-sharing manner.

The multi-nuclear coil tuning control unit can independently control switching between transmission and reception states of a coil channel corresponding to any nuclide, and can independently select any channel. This can achieve individual or combined excitation and acquisition of any different types of nuclides, and reduce mutual influence of signals between different nuclides.

The multi-nuclear coil tuning control unit uses a pair of optical fibers to receive a coil transmission/reception state switching command and a coil tuning/detuning switching command from a computer or a spectrometer. A single-chip microcontroller is used to decode the command to generate an independent control signal, and the control signal is encoded to reduce control signal lines and connector pins.

DETAILED DESCRIPTION OF THE EMBODIMENTS

The technical solutions in the embodiments of the present disclosure are clearly and completely described below with reference to the accompanying drawings in the embodiments of the present disclosure. Apparently, the described embodiments are merely a part rather than all of the embodiments of the present disclosure. All other embodiments derived by those of ordinary skill in the art based on the embodiments of the present disclosure without creative efforts should fall within the protection scope of the present disclosure.

Figure 1:
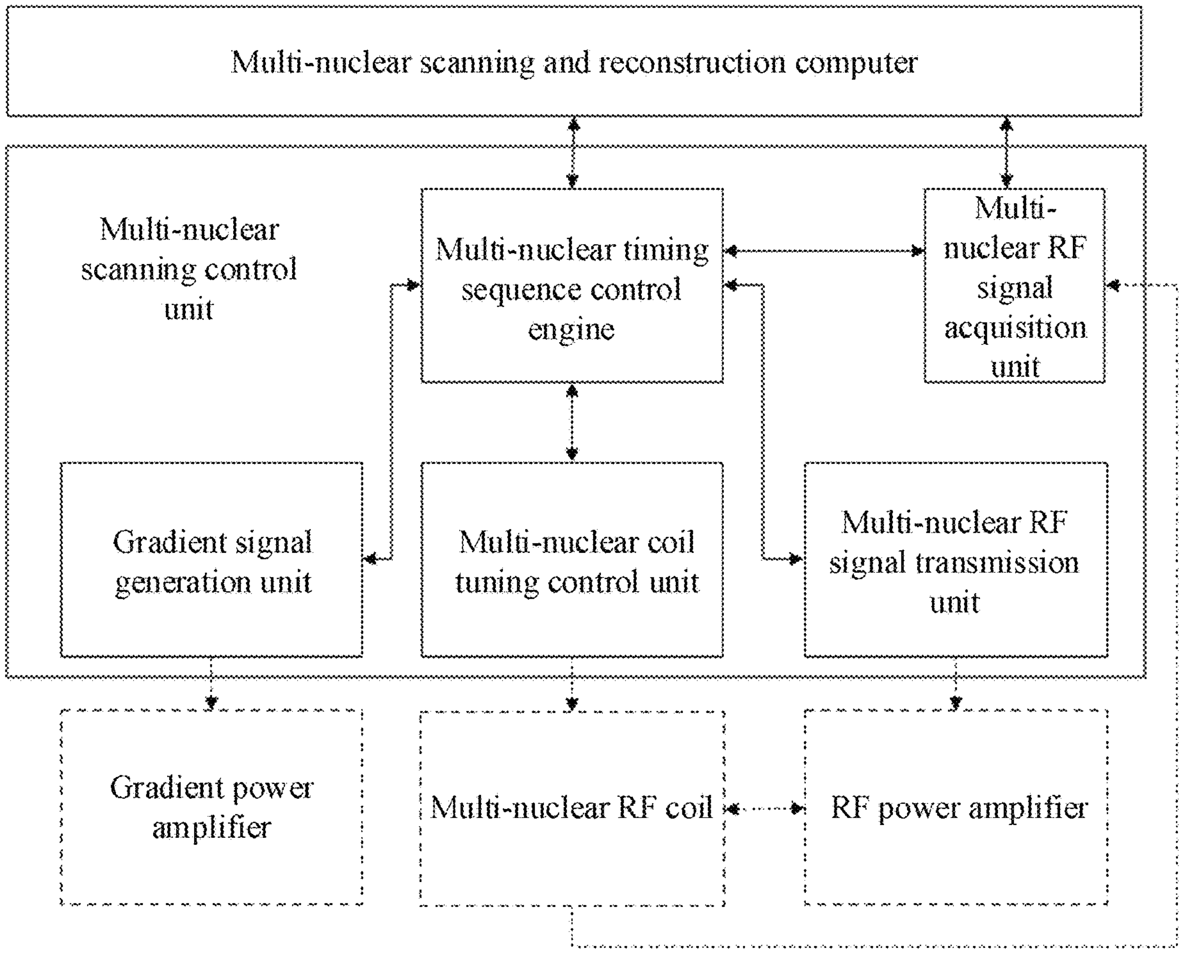
FIG. 1 is a schematic structural diagram of a parallel scalable architecture and highly integrated Simulcast X-nuclei MRI system.

Referring to FIG. 1, a core of a parallel scalable architecture and highly integrated Simulcast X-nuclei MRI system is a precise time management system (a multi-nuclear timing sequence control engine), which enables a gradient field, an RF transmission field, and an RF reception field strictly act on imaging space according to a timing designed by an imaging sequence, and distributes a specified command to a specified component. A purpose of pulse sequence design is to obtain a stable specific MR relaxation signal.

Whether a pulse sequence execution effect meets an ideal requirement reflects execution performance and stability of the multi-nuclear timing sequence control engine, as well as precision of synchronization between another component and the multi-nuclear timing sequence control engine.

Figure 2:
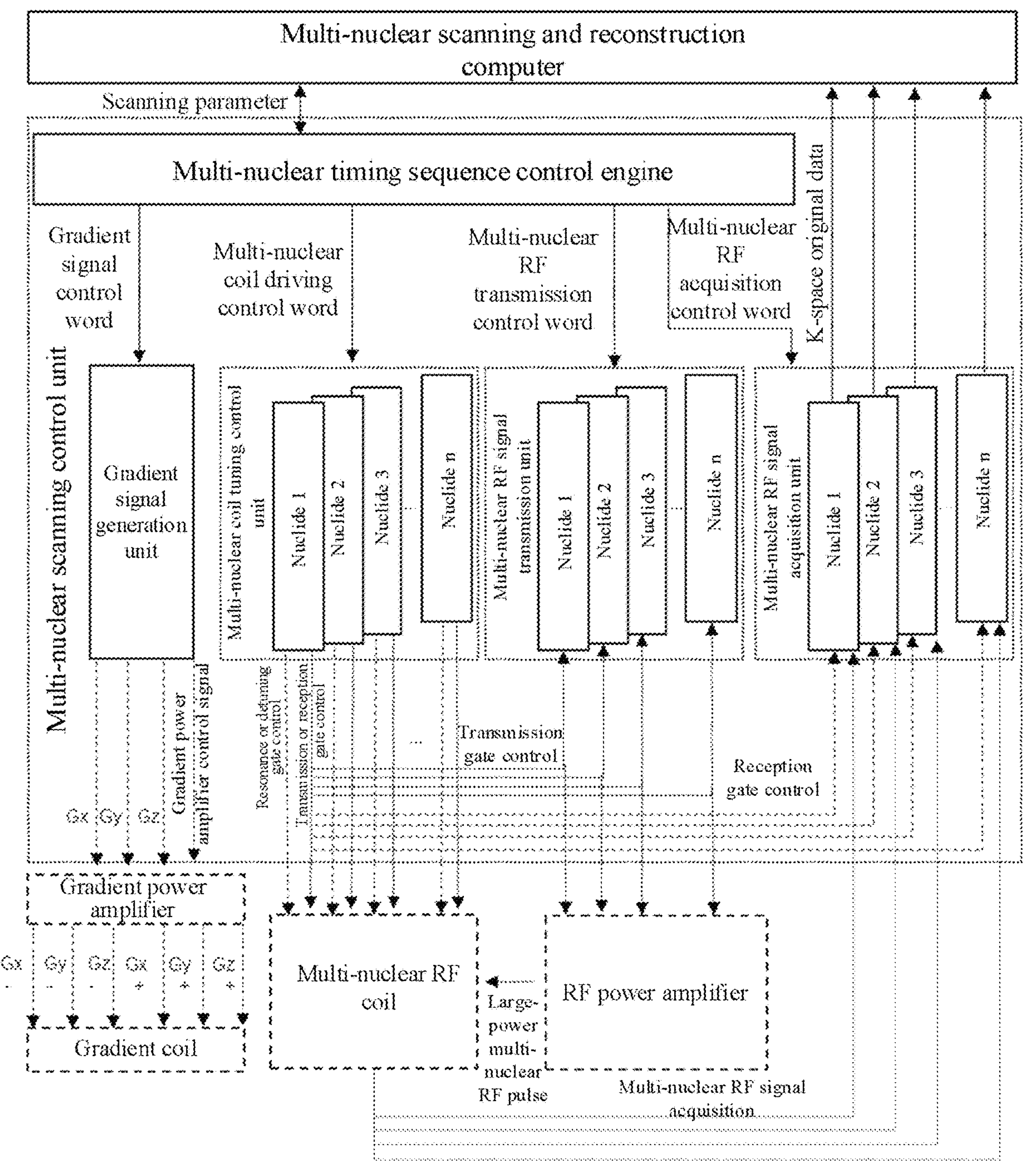
FIG. 2 is a schematic diagram of an embodiment of a parallel scalable architecture and highly integrated Simulcast X-nuclei MRI system.

The parallel scalable architecture and highly integrated Simulcast X-nuclei MRI system adopts a multi-nuclear synchronous and parallel transmission/reception technology of a distributed architecture. Based on this distributed architecture, a transmission frequency channel of a multi-nuclear RF signal transmission unit can be infinitely expanded and freely combined, providing precise frequency signal modulation for any frequency combination. A multi-nuclear RF signal acquisition unit can achieve a same distribution of reception frequency channels as the multi-nuclear RF signal transmission unit, and acquire a corresponding MR RF signal. Synchronous transmission of parallel RF signals of nuclide $^{1}H/^{19}F/^{23}Na/^{31}P$ is shown in an embodiment in FIG. 2. A scanning pulse sequence is sent to the multi-nuclear timing sequence control engine through a multi-nuclear scanning and reconstruction computer. The multi-nuclear timing sequence control engine caches the data to a cache unit of an FPGA chip. A gradient, a RF transmission timing sequence, a RF reception timing sequence, and other information of the nuclide $^{1}H/^{19}F/^{23}Na/^{31}P$ are obtained through parsing by a preset program of the FPGA chip, and a gradient signal control word is separately sent to a gradient signal generation unit. A multi-nuclear coil driving control word of the $^{1}H/^{19}F/^{23}Na/^{31}P$ is sent to a multi-nuclear coil tuning control unit to obtain a multi-nuclear coil driving signal of the nuclide $^{1}H/^{19}F/^{23}Na/^{31}P$ through modulation. A multi-nuclear RF acquisition control word is sent to the multi-nuclear RF signal acquisition unit. A multi-nuclear RF transmission control word is sent to the multi-nuclear RF signal transmission unit. This realizes transmission and reception of RF signals of a plurality of frequency bands without mutual interference, and achieves scalability of a frequency channel in a multi-nuclide MRI system. The frequency channel is theoretically expanded to infinite types of nuclides.

The multi-nuclear scanning and reconstruction computer provides an operation interaction interface for a user to create or select a multi-nuclear scanning sequence, set a multi-nuclear scanning parameter, view a multi-nuclear imaging result, and register and fuse a multi-nuclide image. The multi-nuclear scanning and reconstruction computer sends scanning sequence parameters of different nuclides to the multi-nuclear timing sequence control engine. Based on the scanning sequence parameter, the multi-nuclear timing sequence control engine calculates a control word distributed based on a time series.

The multi-nuclear timing sequence control engine caches the received multi-nuclear scanning sequence parameter sent by the multi-nuclear scanning and reconstruction computer in a dedicated field in a memory of the FPGA chip. The gradient signal control word, the multi-nuclear coil driving control word, the multi-nuclear RF transmission control word, and the multi-nuclear RF acquisition control word are calculated by the FPGA chip by parsing the multi-nuclear scanning sequence parameter, and sent to the gradient signal generation unit, the multi-nuclear coil tuning control unit, the multi-nuclear RF signal transmission unit, and the multi-nuclear RF signal acquisition unit to cache a scanning parameter of each component. After the multi-nuclear coil tuning control unit sends transmission or reception gate control, each component starts to work synchronously. The multi-nuclear RF signal transmission unit synchronously and parallelly excites each nuclide based on the cached parameter, and the multi-nuclear RF signal acquisition unit performs synchronous and parallel acquisition based on the cached parameter.

Figure 3:
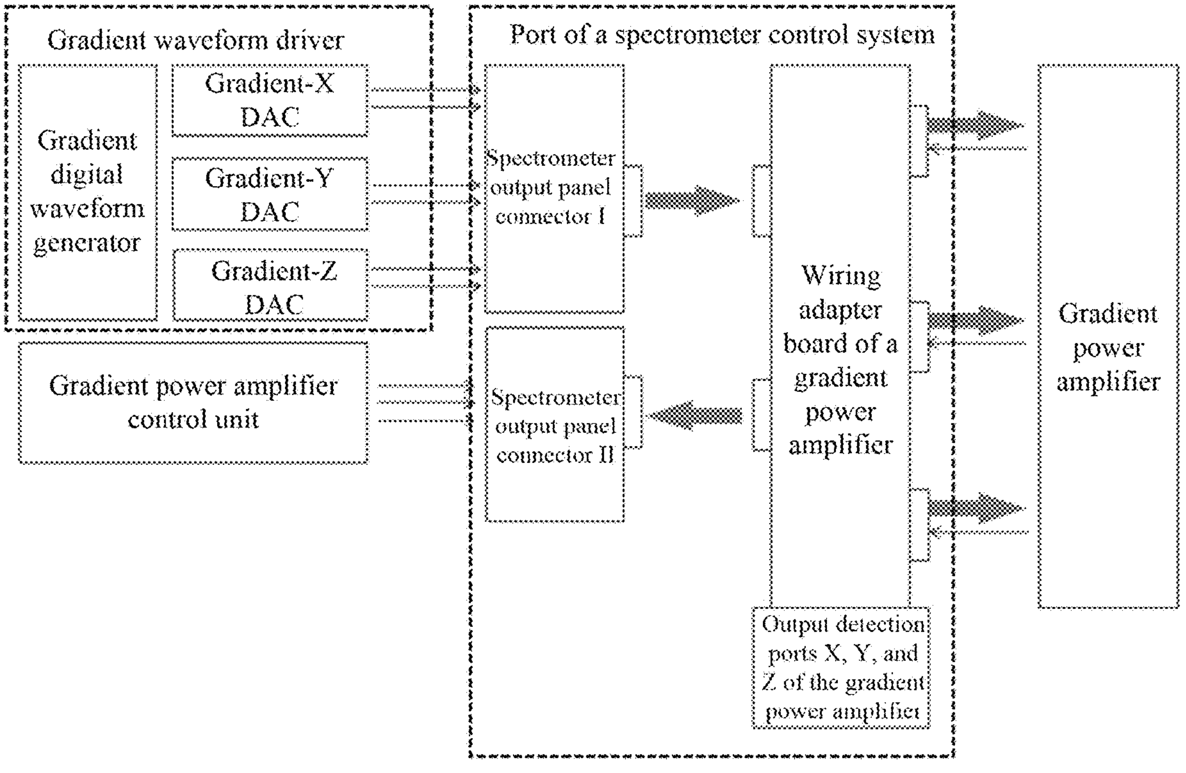
FIG. 3 is a schematic structural diagram of an embodiment of a gradient signal generation unit.

The gradient signal generation unit receives the gradient signal control word, and a fully-digital arbitrary gradient waveform control technology calculates eddy current compensation gradient pre-emphasis, digital gradient coordinate transformation, and direct current drift correction for 8 sets of amplitudes and time constants. A schematic structural diagram of the gradient signal generation unit is shown in FIG. 3. Three gradient waveform generation units drive gradient digital-to-analog conversion unit DAC to output gradient waveforms of analog signals of X, Y, and Z channels. The analog signal is sent to an interface of a multi-nuclear scanning control unit and output to a corresponding channel of a gradient power amplifier for amplification. In addition, an output detection port of the gradient power amplifier returns the amplified analog signal to the multi-nuclear scanning control unit. The gradient power amplifier outputs a gradient pulse to drive three gradient magnetic field coils to generate specific spatial gradient magnetic fields such as a gradient magnetic field for layer selection space, a gradient magnetic field for phase encoding space, and a gradient magnetic field for frequency encoding space, and a gradient magnetic field for other special space.

Figure 4:
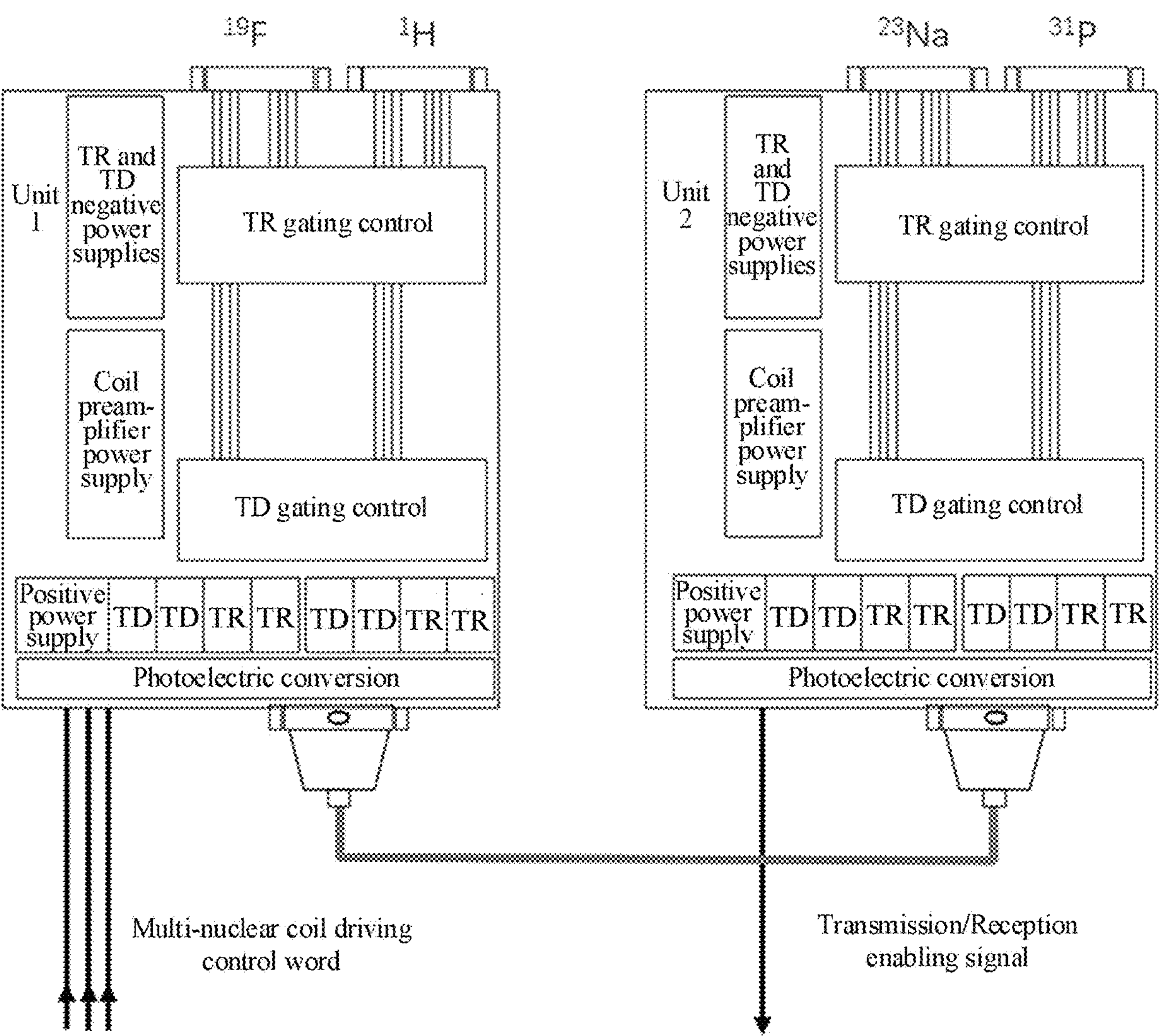
FIG. 4 is a schematic structural diagram of an embodiment of a multi-nuclear coil tuning control unit.

FIG. 4 is a schematic structural diagram of an embodiment of the multi-nuclear coil tuning control unit, which consists of two units. Unit 1 receives an optical signal of the multi-nuclear coil driving control word and forwards the optical signal to unit 2. The unit 1 separately outputs four-channel reception or transmission (TR) and four-channel resonance or detuning (TD) coil control driving signals for the nuclides $^{1}H$ and $^{19}F$, and the unit 2 separately outputs four-channel reception or transmission (TR) and four-channel resonance or detuning (TD) coil control driving signals for the nuclides $^{23}Na$ and $^{31}P$, to drive a multi-nuclear RF coil of the $^{1}H/^{19}F/^{23}Na/^{31}P$ to set reception or transmission (TR) and resonance or detuning (TD) states. Reception and transmission signals of the four nuclides are output by the unit 2 to a RF power amplifier to make the RF power amplifier be in a transmitted and silent state, and are also output to the multi-nuclear RF signal acquisition unit to control the multi-nuclear RF signal acquisition unit to enable acquisition. In the multi-nuclear RF coil, different nuclides are driven by independent multi-nuclear coil tuning control units, and different channels of a same nuclide are driven by a same multi-nuclear coil tuning control unit, thereby saving hardware costs.

Figure 5:
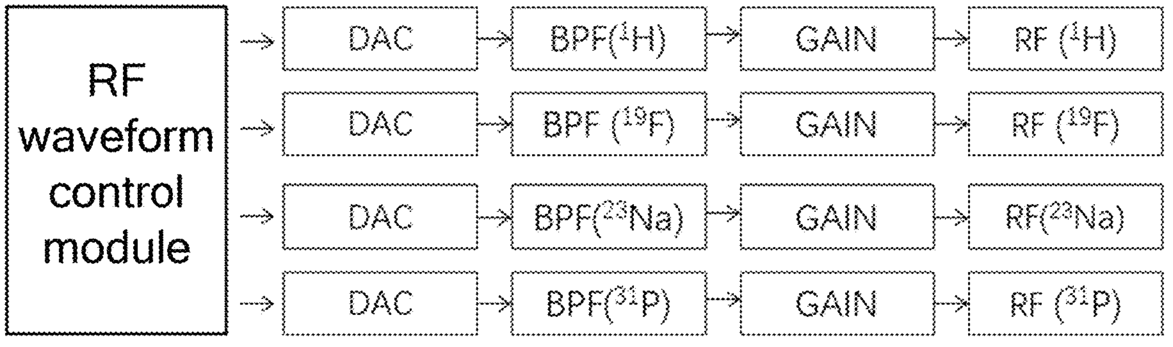
FIG. 5 is schematic structural diagram of an embodiment of a multi-nuclear RF signal transmission unit.

The multi-nuclear RF signal transmission unit includes a plurality of RF transmission channels. A schematic structural diagram in one embodiment is shown in FIG. 5. Each RF transmission channel includes digital-to-analog conversion chip DAC, filtering circuit BPF, and gain control circuit GAIN. Each nuclide uses one RF transmission channel. In this embodiment, a structure of the multi-nuclear RF signal transmission unit is described by using the nuclide $^{1}H/^{19}F/^{23}Na/^{31}P$ as an example to provide various high-precision RF pulse low-power signals for a high-power RF amplifier. Through the multi-nuclear timing sequence control engine, each RF signal transmission unit sets the multi-nuclear RF transmission control word to independently modulate a RF waveform and a timing sequence of each nuclide. In this embodiment, the multi-nuclear RF signal transmission unit includes the nuclide $^{1}H/^{19}F/^{23}Na/^{31}P$. A multi-nuclear RF control word includes a multi-nuclear RF excitation frequency, a multi-nuclear RF width, multi-nuclear RF pulse excitation duration, and a digital modulation field of a multi-nuclear RF pulse waveform. A frequency distribution of each excitation is calculated based on a multi-nuclear RF and the multi-nuclear RF width of the multi-nuclear RF control word. The multi-nuclear RF pulse excitation duration and a digital modulation field of a multi-nuclear RF pulse waveform of a corresponding nuclide are used to perform variable-magnification intermediate interpolation on an actually required analog RF signal. An analog RF waveform required for each nuclide is calculated and sent to the digital-to-analog conversion chip DAC to be converted into an analog RF signal. The analog RF signal undergoes transmission gain control after passing through a filter of a corresponding frequency band of each nuclide and is output to the RF power amplifier to drive a multi-nuclear RF coil of a corresponding frequency to generate a spatial electromagnetic field. In this way, an imaging voxel in imaging space absorbs RF energy in the space and resonates.

Figure 6:
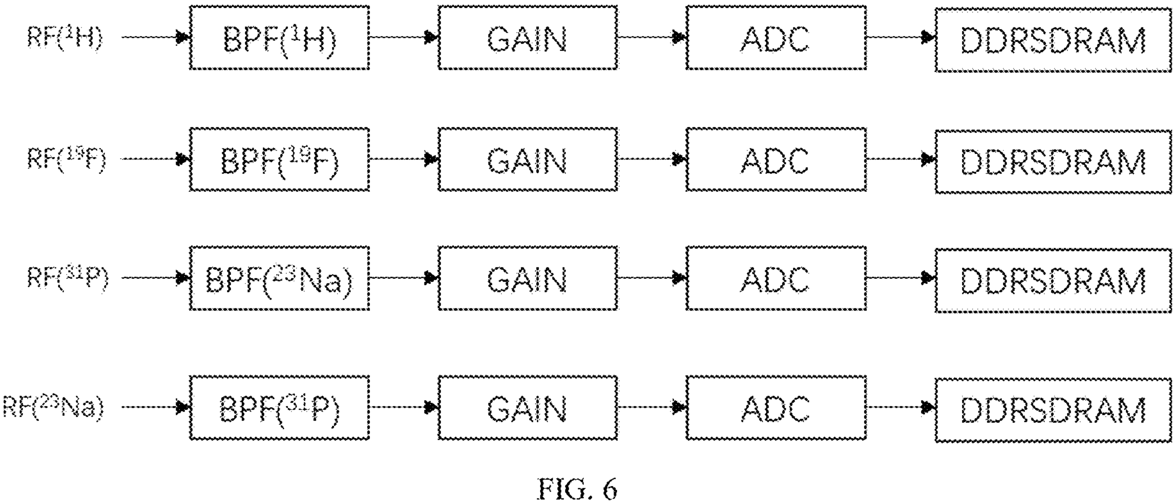
FIG. 6 is a schematic structural diagram of an embodiment of a multi-nuclear RF signal acquisition unit.

In an embodiment, a schematic structural diagram of the multi-nuclear RF signal acquisition unit is shown in FIG. 6. This embodiment illustrates signal acquisition of four nuclides. Each nuclide includes of filtering circuit BPF, gain control circuit GAIN, analog-to-digital conversion chip ADC, and a double data rate synchronous dynamic random access memory DDRSDRAM dedicated fields that are corresponding to each frequency band of the nuclide. The multi-nuclear RF signal acquisition unit receives the multi-nuclear RF acquisition control word sent by the multi-nuclear timing sequence control engine and stores the multi-nuclear RF acquisition control word in a specific field of a double data rate synchronous dynamic random access memory DDRSDRAM of an acquisition unit corresponding to each nuclide. After waiting for the multi-nuclear coil tuning control unit to send a reception enabling signal, the multi-nuclear RF coil removes a signal outside a frequency band from a received MR analog signal through the band-pass filtering circuit BPF. Then the filtered MR analog signal enters a gain amplifier to amplify power. The analog-to-digital conversion chip ADC performs high-frequency direct sampling on the analog signal and caches the sampled analog signal in the double data rate synchronous dynamic random access memory DDRSDRAM of the multi-nuclear RF signal acquisition unit. Based on a quantity of accumulation times, a digital signal obtained through the high-frequency direct sampling is digitally accumulated and then sent to the multi-nuclear scanning and reconstruction computer for image reconstruction.

It should be understood that although the steps in the flowcharts of the embodiments in the present disclosure are sequentially displayed according to the arrows, these steps are not necessarily performed in the order indicated by the arrows. The execution order of these steps is not strictly limited, and these steps may be executed in other orders, unless clearly described otherwise. Moreover, at least some of the steps in the embodiments may include a plurality of sub-steps or stages. The sub-steps or stages are not necessarily executed at the same time, but may be executed at different times. The sub-steps or stages are not necessarily carried out sequentially, but may be executed alternately with other steps or at least some of sub-steps or stages of other steps.

Those of ordinary skill in the art may understand that all or some of the procedures in the methods of the foregoing embodiments may be implemented by a computer program instructing related hardware. The program may be stored in a nonvolatile computer-readable storage medium. When the program is executed, the procedures in the embodiments of the foregoing methods may be performed. Any reference to a memory, a storage, a database, or other mediums used in the embodiments provided in the present disclosure may include a nonvolatile memory and/or a volatile memory. The nonvolatile memory may include a read-only memory (ROM), a programmable ROM (PROM), an electrically programmable ROM (EPROM), an electrically erasable programmable ROM (EEPROM), or a flash memory. The volatile memory may include a random access memory (RAM) or an external cache memory. As an illustration rather than a limitation, the RAM can be obtained in a plurality of forms, such as a static RAM (SRAM), a dynamic RAM (DRAM), a synchronous DRAM (SDRAM), a double data rate SDRAM (DDRSDRAM), an enhanced SDRAM (ESDRAM), a synchronization link (Synchlink) DRAM (SLDRAM), a Rambus direct RAM (RDRAM), a direct Rambus dynamic RAM (DRDRAM), and a Rambus dynamic RAM (RDRAM).

The technical features of the foregoing embodiments can be employed in arbitrary combinations. For brevity of description, not all possible combinations of the technical features of the foregoing embodiments are described. However, the combinations of the technical features should be construed as falling within the scope described in this specification as long as there is no contradiction in the combinations.

The above embodiments merely represent several implementations of the present disclosure, and the descriptions thereof are specific and detailed, but they should not be construed as limiting the patent scope of the present disclosure. It should be noted that those of ordinary skill in the art can further make several variations and improvements without departing from the concept of the present disclosure, and all of these fall within the protection scope of the present disclosure. Therefore, the protection scope of the present disclosure shall be subject to the protection scope defined by the claims.

The above are merely preferred embodiments of the present disclosure, and not intended to limit the present disclosure. Any modifications, equivalent replacements, and improvements made within the spirit and principle of the present disclosure should fall within the protection scope of the present disclosure.

What is claimed is:

1. A parallel scalable architecture and highly integrated Simulcast X-nuclei magnetic resonance imaging (MRI) system, comprising a multi-nuclear scanning and reconstruction computer and a multi-nuclear scanning control unit, wherein the multi-nuclear scanning control unit comprises a multi-nuclear timing sequence control engine, a multi-nuclear radio frequency (RF) signal transmission unit, a multi-nuclear RF signal acquisition unit, a gradient signal generation unit, and a multi-nuclear coil tuning control unit; the multi-nuclear timing sequence control engine is separately connected to the multi-nuclear RF signal transmission unit, the multi-nuclear RF signal acquisition unit, the gradient signal generation unit and the multi-nuclear coil tuning control unit; the gradient signal generation unit is also connected to a gradient power amplifier; the multi-nuclear coil tuning control unit and the multi-nuclear RF signal acquisition unit are both connected to a multi-nuclear RF coil; and the multi-nuclear timing sequence control engine and the multi-nuclear RF signal acquisition unit are both connected to the multi-nuclear scanning and reconstruction computer.

2. The parallel scalable architecture and highly integrated Simulcast X-nuclei MRI system according to claim 1, wherein the multi-nuclear scanning and reconstruction computer is connected to the multi-nuclear scanning control unit, and configured to receive a user scanning command, calculate and send a multi-nuclear scanning parameter to the multi-nuclear scanning control unit, and receive K-space original data of multi-nuclide MRI of the multi-nuclear scanning control unit.

3. The parallel scalable architecture and highly integrated Simulcast X-nuclei MRI system according to claim 1, wherein the multi-nuclear timing sequence control engine is configured to receive and parse scanning information of a plurality of nuclides, generate a scanning event, and send the scanning event to the multi-nuclear RF signal transmission unit, the multi-nuclear RF signal acquisition unit, the gradient signal generation unit and the multi-nuclear coil tuning control unit to achieve MRI.

4. The parallel scalable architecture and highly integrated Simulcast X-nuclei MRI system according to claim 1, wherein the multi-nuclear RF signal transmission unit comprises a plurality of RF transmission channels, each of the plurality of RF transmission channels comprises a digital-to-analog conversion chip DAC, a bandpass filtering circuit BPF and a gain control circuit, each nuclide uses one RF transmission channel of the plurality of RF transmission channels, an input terminal of the digital-to-analog conversion chip DAC is connected to an RF waveform control module, an output terminal of the digital-to-analog conversion chip DAC is connected to an input terminal of the bandpass filtering circuit BPF, an output terminal of the bandpass filtering circuit BPF is connected to an input terminal of the gain control circuit, and an output terminal of the gain control circuit is connected to the multi-nuclear RF coil.

5. The parallel scalable architecture and highly integrated Simulcast X-nuclei MRI system according to claim 1, wherein the multi-nuclear RF signal acquisition unit comprises a plurality of RF reception channels, each of the plurality of RF reception channels comprises an analog-to-digital conversion chip ADC, a bandpass filtering circuit BPF and a gain control circuit, each nuclide uses the plurality of RF reception channels, an output terminal of the multi-nuclear RF coil is connected to an input terminal of the bandpass filtering circuit BPF, an output terminal of the bandpass filtering circuit BPF is connected to an input terminal of the gain control circuit, an output terminal of the gain control circuit is connected to an input terminal of the analog-to-digital conversion chip ADC, an output terminal of the analog-to-digital conversion chip ADC is connected to a double data rate synchronous dynamic random access memory DDRSDRAM of each nuclide, and the double data rate synchronous dynamic random access memory DDRSDRAM of each nuclide is connected to the multi-nuclear scanning and reconstruction computer.

6. The parallel scalable architecture and highly integrated Simulcast X-nuclei MRI system according to claim 1, wherein the gradient signal generation unit is configured to generate three gradient waveforms (Gx, Gy, and Gz) and a gradient power amplifier control signal, each gradient waveform driver comprises a gradient digital waveform generator and a gradient digital-to-analog converter DAC, and is output to the gradient power amplifier through a port of a spectrometer control system, the three gradient waveforms enter a first spectrometer output panel connector, a gradient power amplifier control unit generates the gradient power amplifier control signal and outputs the gradient power amplifier control signal to a second spectrometer output panel connector, the first spectrometer output panel connector and the second spectrometer output panel connector-HI are both connected to a wiring adapter board of the gradient power amplifier, and are simultaneously connected to the gradient power amplifier through the wiring adapter board of the gradient power amplifier, and the gradient power amplifier returns gradient power amplifier monitoring signals of X, Y, and Z axes in real time during working, and sends the gradient power amplifier monitoring signals to gradient power amplifier output monitoring terminals X, Y, and Z of the wiring adapter board of the gradient power amplifier.

7. The parallel scalable architecture and highly integrated Simulcast X-nuclei MRI system according to claim 1, wherein the multi-nuclear coil tuning control unit is configured to receive multi-nuclide reception and transmission timing parameters from the multi-nuclear timing sequence control engine, and calculate level signals used to drive control of transmission, reception, resonance, and detuning states of a multi-nuclear RF magnetic resonance (MR) coil.

* * * * *